US009697898B2

(12) United States Patent
Adams et al.

(10) Patent No.: US 9,697,898 B2
(45) Date of Patent: *Jul. 4, 2017

(54) CONTENT ADDRESSABLE MEMORY WITH AN ORDERED SEQUENCE

(71) Applicant: International Business Machines Corporation, Armonk, NY (US)

(72) Inventors: Samuel Scott Adams, Rutherfordton, NC (US); Suparna Bhattacharya, Bangalore (IN); Robert R. Friedlander, Southbury, CT (US); James R. Kraemer, Santa Fe, NM (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/863,711

(22) Filed: Sep. 24, 2015

(65) Prior Publication Data

US 2017/0092358 A1    Mar. 30, 2017

(51) Int. Cl.
*G11C 15/00*    (2006.01)

(52) U.S. Cl.
CPC .................... *G11C 15/00* (2013.01)

(58) Field of Classification Search
CPC ......... G11C 15/00; G11C 15/02; G11C 15/04; G11C 15/043; G11C 15/046; G11C 15/06
See application file for complete search history.

(56) References Cited

U.S. PATENT DOCUMENTS

| 6,336,113 | B1* | 1/2002 | Yoneda | .................. G11C 15/00 |
| 7,228,378 | B1* | 6/2007 | Pereira | .................. G11C 15/00 365/49.15 |
| 7,434,008 | B2 | 10/2008 | Shaw | |
| 8,468,297 | B2 | 6/2013 | Bhattacharya | |
| 2004/0078516 | A1* | 4/2004 | Henderson | .......... G06F 12/0875 711/108 |
| 2011/0320704 | A1* | 12/2011 | Bhattacharya | ...... G06F 12/0864 711/108 |
| 2014/0047170 | A1 | 2/2014 | Cohen et al. | |

* cited by examiner

*Primary Examiner* — Khamdan Alrobaie
(74) *Attorney, Agent, or Firm* — Fleit Gibbons Gutman Bongini Bianco PL; Jon A. Gibbons

(57) ABSTRACT

A content addressable memory system, method and computer program product is described. The memory system comprises a location addressable store having data identified by location and multiple levels of content addressable stores each holding ternary content words. The content words are associated with references to data in the location addressable store and the content words containing at least one next entry bit for sorting content words in a physical ordered sequence to create content ordered memory. The content store levels might be implemented using different technologies that have different performance, capacity, and cost attributes. The memory system includes a content based cache for improved performance and a content addressable memory management unit for managing memory access operations and virtual memory addressing.

20 Claims, 10 Drawing Sheets

CONTENT ADDRESSABLE MEMORY WITH AN ORDERED SEQUENCE

BACKGROUND

The invention relates generally to computer memory systems, and more particularly to a content addressable memory system, method and computer program product for accessing and managing data in the content addressable memory system.

Memory hierarchy and virtual memory models used in today's computers typically use addressing schemes where memory content is accessed by location in physical and virtual address spaces, i.e., data is uniquely referenced by the location where it resides. While virtual addressing allows data to be accessed and manipulated without being concerned with the actual underlying physical location and memory address of the data, it only does so in large units of contiguous memory locations like memory pages.

In general, data representations based on address contiguity such as arrays are often used by software applications because they involve less intermediate references to data and tend to be simpler. Spatial locality of reference has thus become an inherent consideration for efficient software implementations. Efforts by programmers to increase locality of reference in applications are now a common optimization strategy. Such an optimization is usually effective; however, in some situations it could introduce undue constraints and overheads in memory usage. For example, it is often difficult to predict the exact size of a contiguous memory space needed or to select the most efficient data lookup structures ahead of time. This is especially true in large applications which require a high amount of flexibility and comprise several independently built software components that are dynamically integrated. Software optimization based on locality of reference may therefore lead to fragmentation, wasted space and even extra processing when software developer choices turn out to be inappropriate.

Content addressable memory (CAM) systems can address this problem by virtue of fast parallel key-value lookup and range matching capabilities. In particular a general purpose virtual content addressable memory system provides an attractive alternative to traditional location based addressing which suffers from the above described restriction of unidimensional spatial locality constraints.

However, CAM/TCAM (ternary content addressable memory) systems lack support for ordered access, such as locating the next element in a hierarchy or iterating through a sequence, a key requirement for many applications and data structures. In network routers using TCAMs, this issue is addressed by storing keys in a desired physical order and employing a priority encoder that selects the first match in a range, as stored in the lowest physical address. This approach is unsuitable for a general purpose virtual content addressable memory system, where storing all TCAM entries sorted in physical order is not only impractical but also defeats the key strengths of content addressable models (i.e. their flexibility, freedom from spatial contiguity constraints and support for multiple key dimensions).

The above drawbacks of existing solutions motivate a need for an efficient content addressable memory system that can support ordered sequences and a method for using the memory system to traverse these sequences without losing the benefits offered by pure content addressing.

SUMMARY

Disclosed is a computer program product, method, and content addressable memory system, for accessing and managing data in the content based memory system. The system comprises a location addressable store having data addressable by location and multiple levels of content addressable stores containing ternary content words with at least one next entry bit for sorting content words in a physical ordered sequence to create content ordered memory. The phrase "physical ordered sequence" as used in this patent means the content words are placed in successive memory locations or address contiguity for a given data representation typically with consecutive content values. The content words are associated with respective references to data in the location addressable store.

The details of the preferred embodiments of the invention, both as to its structure and operation, are described below in the Detailed Description section in reference to the accompanying drawings. The Summary is intended to identify key features of the claimed subject matter, but it is not intended to be used to limit the scope of the claimed subject matter.

BRIEF DESCRIPTION OF THE DRAWINGS

The accompanying figures wherein reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
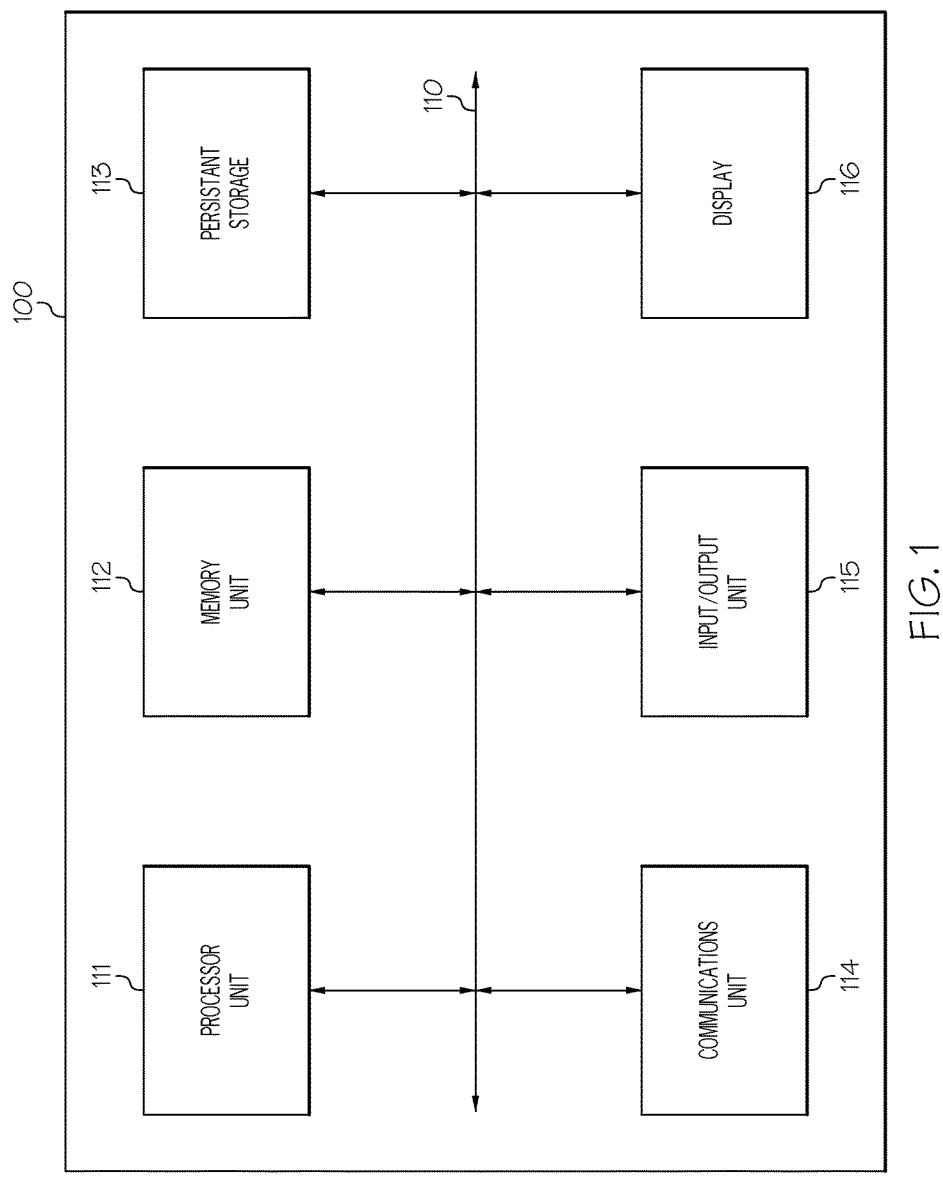
FIG. 1 is a block diagram of a typical data processing system in which aspects of the present invention may be implemented.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention relates to a content addressable memory system, method and computer program product for accessing and managing data in a content addressable memory system. A content addressable memory, also known as an associative memory, is an implementation of associative data processing. Associative processing manipulates data based on matching, or associating, an input value with other values stored in an array. Associative processing incorporates a limited amount of computational capability at each memory location that allows the entire memory array to be examined at once. A content addressable memory compares an input value to all the associative data stored in the memory array. The output from the memory may be a flag that indicates one or more content matches or associated data that is related in some way to the matched content values.

The present invention provides demand-driven content ordering that can be managed by the operating system. The present invention maintains the benefits of freedom from spatial locality constraints in pure content addressing.

Further, the present invention is compatible with virtual TCAM (ternary content addressable memory) design including pre-fetching in content order. The results of ordering can be reused or shared. The system can manage the space versus time trade-off based on resource availability and access characteristics.

Moreover, custom sorting schemes can be assigned to different parts of the content space via the same associative lookup CAM (content addressable memory) mechanism, such as a software defined mechanism. These may include multiple sorting scheme examples, such as numeric, longest prefix wise, coarse to fine, order by field, different similarity measures, concurrency/sharing, whether/how to support different sorting views for the same data.

Content Addressable Memory

Content addressable memory (CAM) and ternary content addressable memory (TCAM) technologies provide very fast constant time lookups over a reasonably large array of data, typically through some form of parallel match scheme or optimized dedicated comparison circuitry implemented in hardware. Ternary content addressable memories allow entries to be stored so that any bit position can be a "don't care" bit instead of 0 or 1, allowing compact and flexible data representations.

A content addressable memory makes it possible to handle list searches and data translation as embedded functions within a system. The combination of a content addressable memory and a state machine creates an economical controller for real-time processes that perform data look-ups and translations, and data maintenance in sparsely populated tables. For example, an asynchronous transfer mode (ATM) switch must search internal tables that hold the necessary information for each connection that routes through the switch. The index to these tables is the virtual-path identifier (VPI) for the VPI/virtual channel identifier (VCI) combination from the header of an incoming data cell. The switch uses this information to look up the VPI and VCI for the outgoing link, the internal path through the switch to the correct output port, billing rates, traffic-flow parameters, flags for any special functions, etc. A content addressable memory is particularly suited for such an application.

Data Processing System

Referring now to the drawings and in particular to FIG. 1, there is depicted a block diagram of a data processing system in which aspects of the present invention might be implemented. As shown, a data processing system 100 includes a processor unit 111, a memory unit 112, a persistent storage 113, a communications unit 114, an input/output unit 115, a display 116 and a system bus 110. Computer programs are typically stored in the persistent storage 113 until they are needed for execution, at which time the programs are brought into the memory unit 112 so that they can be directly accessed by the processor unit 111. The processor unit 111 selects a part of memory unit 112 to read and/or write by using an address that the processor 111 gives to memory 112 along with a request to read and/or write. Usually, the reading and interpretation of an encoded instruction at an address causes the processor 111 to fetch a subsequent instruction, either at a subsequent address or some other address. The processor unit 111, memory unit 112, persistent storage 113, communications unit 114, input/output unit 115, and display 116 interface with each other through the system bus 110.

Content Addressable Memory

Figure 2:
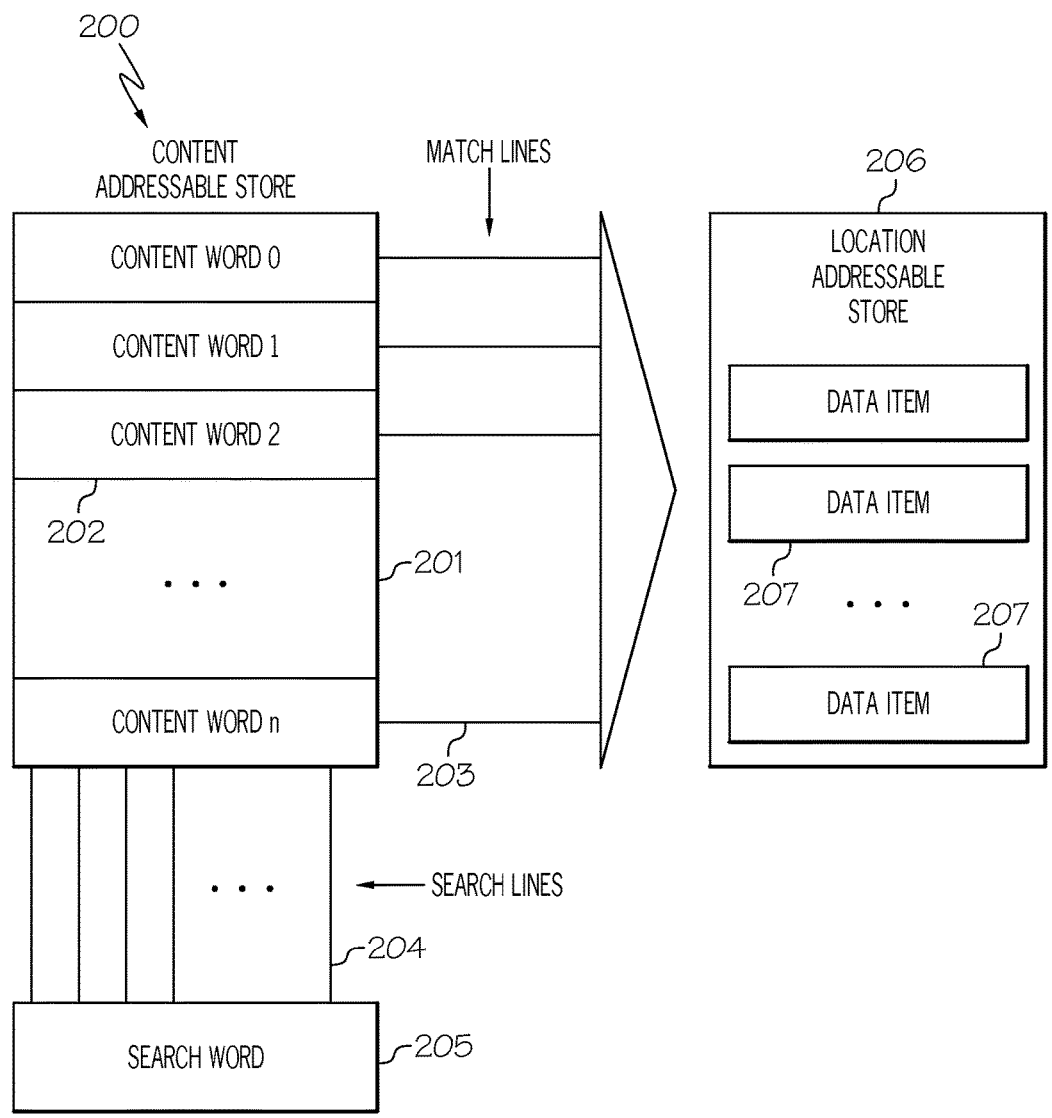
FIG. 2 is a block diagram illustrating an example of a content addressable memory system, in accordance with aspects of the invention.

FIG. 2 illustrates a block diagram of an example embodiment of a content addressable memory system 200, in accordance with aspects of the invention. The content addressable memory system 200 comprises a content addressable store 201 that contains content words 202. Each content word 202 has a data reference that points to a data item 207 in the location addressable store 206. When a search word 205 needs to be looked up in the memory system 200, the search word 205 is compared to the content words 202 currently in the content addressable store 201 through search lines 204. If the search word 205 is present in the store 201, then data item 207 associated with the search word 205 is identified in the location addressable store 206 through match lines 203, and retrieved accordingly.

The example content addressable memory system 200 enhances existing memory systems and virtual memory models to enable an alternative memory access that disassociates considerations of spatial locality and contiguity from the way data is addressed. This disassociation reduces the system overheads discussed above and effectively provides a fine grained virtual to physical address mapping. A generalized content addressable memory hierarchy, as further described below in the example embodiments of the invention, enables such an address mapping.

Search Map

Figure 3:
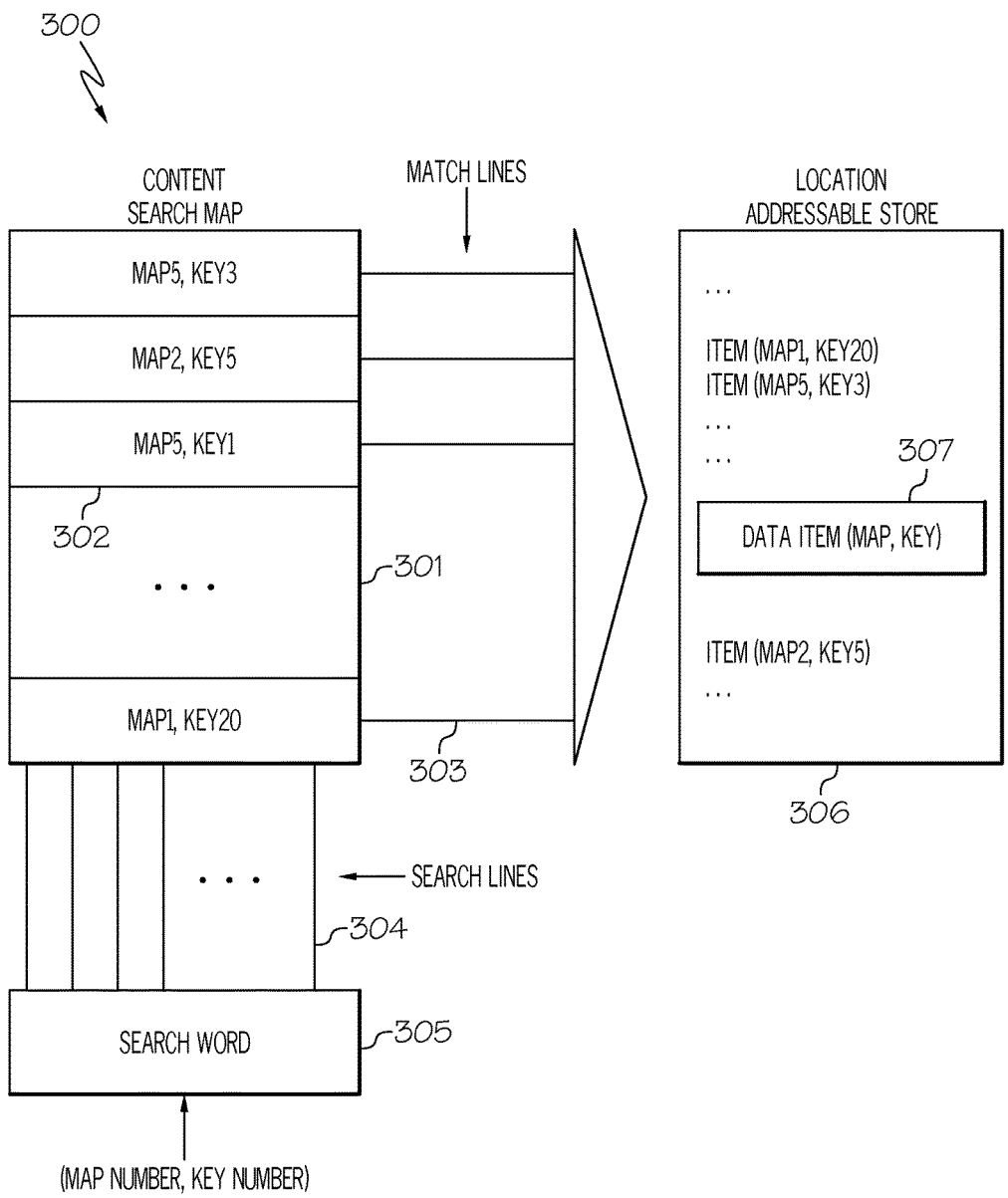
FIG. 3 is a block diagram showing an example of a search map for finding a desired content word in a content addressable memory system, in accordance with aspects of the invention.

FIG. 3 is a block diagram of an example search map 301 for identifying a desired content word in a content addressable memory system 300, in accordance with aspects of the invention. As an example, the search map 301 is based on map-key relationships 302 provided in the content addressable memory stores for finding particular content words. Other search maps may use different relationships associated with the content words to search for the desired content words. Each map-key relationship 302 is associated with a content word 202 in the content addressable store 201. A map-key relationship 302 includes information on a search key, e.g., key 305, for identifying a respective content word 202 in the content addressable memory store 300. When a search word 305 needs to be looked up in the memory system 300, a map-key relationship for the search word 305, similar to the map-key relationships 302, is compared through match lines 304 to the map-key relationships 302 of the map-key table 301. If there is a match between the map-key relationship of the search word 305 and a map-key relationship 302 in the map-key table 301, then the content word 202 associated with the matching map-key relationship 302 is the search word 305 being searched for. Data item 307, which is in the location addressable store 306 and referenced by the matching content word 202, may then be identified through match lines 303 using the data reference of the matching content word.

Content Addressable Store Hierarchy

In the example embodiments of the invention, a content addressable memory store associates ternary content words with corresponding data references. A reference can point to a memory address (and size) in a location addressable store. Other embodiments may provide the relationship between content words and data as inlined data. A content addressable store hierarchy has multiple levels of stores each accommodates a set of content words and typically has certain performance, capacity, and cost attributes. The stores in each level of the content addressable hierarchy map content words to data references. The internal implementation of content addressability may be different at each level of the memory hierarchy. The store levels closer to the processor are referred to as the higher levels, e.g., level 1 is higher than level 2 and closer to the processor than level 2, and level 2 is higher than level 3 and closer to the processor than level 3. In the example embodiments, the higher levels of content based stores generally have better performance at a higher cost, and the levels that are farther away from the processor generally have more capacity and might consume less power per bit. The store levels in the content memory hierarchy may be embodied in hardware or software, or a combination thereof, for achieving the mapping between content words and data references based on performance, capacity, and cost objectives.

Figure 4:
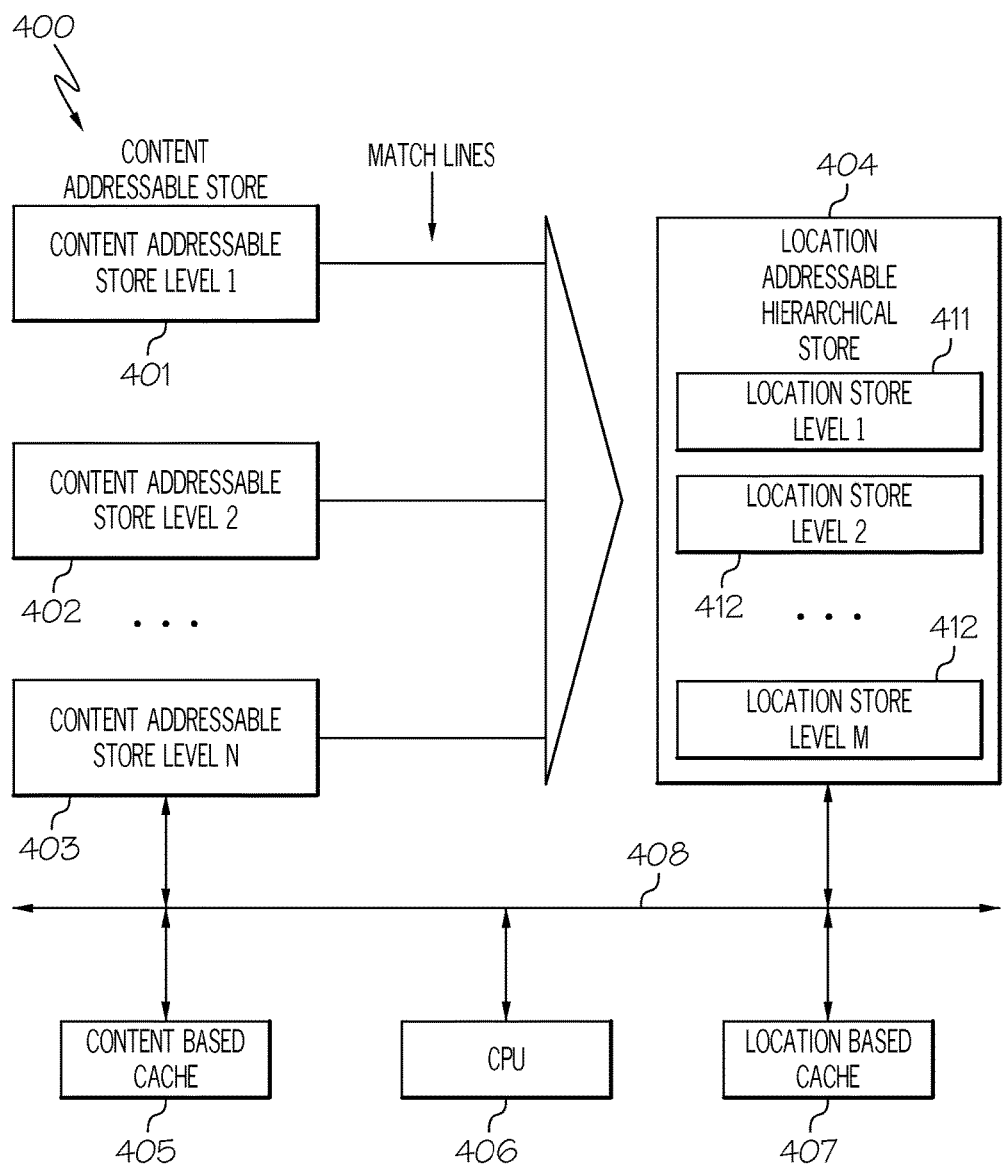
FIG. 4 is a block diagram illustrating am example content addressable memory system with multiple levels of stores, a content based cache, and a location based cache, in accordance with aspects of the invention.

FIG. 4 is a block diagram illustrating an example embodiment of a content addressable memory hierarchical system 400 that has multiple levels of content addressable stores 401-403, in accordance with aspects of the invention. The content based memory system 400 is an example of a content memory hierarchy which has been generalized to facilitate the description of the components and operation of the system. Each of the store levels 401-403 in the hierarchical content addressable system 400 may be implemented using hardware memory components, software, or a combination of hardware and software components. For example, a combined CAM-RAM content addressable memory system may store content words in ternary content addressable memory modules whose match lines are associated with corresponding pointers in RAM modules.

The combination of the various levels in a content addressable memory hierarchy enables system performance to be optimized based on desired performance, capacity and cost. The example embodiments of the content memory hierarchy move content words from lower levels to higher levels and vice-versa, based on demand and access frequency in a policy-dependent manner to take advantage of the performance and capacity benefits provided by each store level.

FIG. 4 further shows a system bus 408 through which the content addressable memory hierarchy 400 communicates with a CPU 406 and other components in the computer system. Location addressable store 404 also has multiple store levels 411-412 that contain data items associated with the content words in the content addressable hierarchy 400. A location addressable memory store level 411-412 is similar to a traditional memory where data is referenced by its memory address location. Addressing could be physical or virtual, and the location memory hierarchy could span multiple levels 411-412 of memory and secondary storage (e.g., disk storage).

When presented with a search word (which may have some bits masked out), the example content memory system of FIG. 4 retrieves matching content words and their corresponding data references from the content addressable memory hierarchy 400. Since multiple entries may match a search word, the content memory system 400 may return a stream of multiple results, which would require some kind of priority arbitration to be applied if a single result is desired. In addition, the content memory system 400 may create new content words to be added to the hierarchy as well as removing existing content words from the content stores as needed.

Content Based Cache and Location Based Cache

The example content memory system 400 shown in FIG. 4 includes a content based cache unit 405 and a location based cache unit 407 for improving the performance of the system. The caches 405 and 407 temporarily hold certain content words and data items, respectively, that have been retrieved from the content addressable store and location addressable store. The criteria for determining which content words and data items to be held in the caches 405 and 407 may be based, for example, on data that is recently-used or frequently-used in the system.

In the example embodiment of the invention in FIG. 4, the content based cache 405 contains <content word, offset range> tuples where an offset range indicates the address offset of a data item in the location addressable store that is referenced by the content word. If the data reference for a content word is already in the location based cache, then the content based cache refers to that data reference. Otherwise, the example memory system of the invention loads data associated with the content word into the location based cache 407 and points to the data from the content based cache. The system may maintain frequently accessed content word entries in the content based cache 405 to avoid additional processing associated with indexing overhead and ensure data consistency. Multiple matches to a content word are possible as there could be multiple entries for the same content word in the content memory system.

Prefetching a content word and storing it in the content cache 405 may be based on content locality rather than address locality. For a given content word, the illustrated embodiment of the invention may load data into the location based cache 407 in cache line size chunks (or smaller units if the data is less than cache line size), around a desired address offset. As an example, the illustrated content addressable memory hierarchy 400 may be implemented using a CAM-SRAM combination, effectively acting as a translation look-aside buffer for a virtual-physical address mapping in a computer system.

The location based cache 407 is provided for caching data from the location addressable store 404. Data in the location based cache 407 is directly indexed by a cache address and also associated with and searchable by a location address range. Further, a reference count that indicates the number of content words that point to the same data item may be used. The reference count is associated with each entry in the location based cache 407.

Content Page and Content Block

In the example embodiments of the invention as described, a content page is the results of a content word search that match a page size range in the content key space. The content key space is a collection of entries in a content addressable memory store whose content keys, such as map-key relationships, fall within a page range from each other where the range is page size aligned. For example, if the content key space is divided into 4-Kbyte pages, then the least significant 12 bits of the search word would be marked as "don't care" bits when the memory system retrieves a content page. The entries in a content page could be distributed across the content addressable memory store with no implied physical contiguity or ordering. These entries are part of a logical representation of a page, rather than a real memory page. A content page typically has empty areas within the page, i.e., sparse mapping. As a result, the physical size corresponding to a content page is usually smaller than a real memory page. In addition, since multiple entries may match the same content word, it is even for the physical size to be larger than a real memory page.

A content block is a group of content words that are consecutive in the content based address space, i.e., the content key space, and reference consecutive units of data in the location based address space. These consecutive entries in the content key space may be compressed into a single content block entry in the content memory if the range of content words can be represented as a ternary block. For example, consider an array of eight location data entries that are consecutive in the location address space and referenced by eight content words in the content address space. These content words can be combined into a single mapping, with the least significant three bits being marked as "don't care" bits, and the data references that point to these content words are labeled as a block with location units of size that match the array entry size.

As a further example, if the fifth element of the array is referenced by content, then the search word would map to a ternary block mapping, and the relative offset of the location where data is to be retrieved, i.e., 5 times unit size, can be calculated from the search word and the beginning of the ternary block. If the array is extended to four more elements, then the new elements can reside in a different location area with a new content word mapping created to cover the range of those four elements. Thus, if the tenth element is referenced by content, then the search word would match this new entry without additional referencing. This process enables a location based addressing to be supported in the memory system using one large ternary block mapping for the entire location range.

Content Addressable Memory Management Unit (CAMMU)

Figure 5:
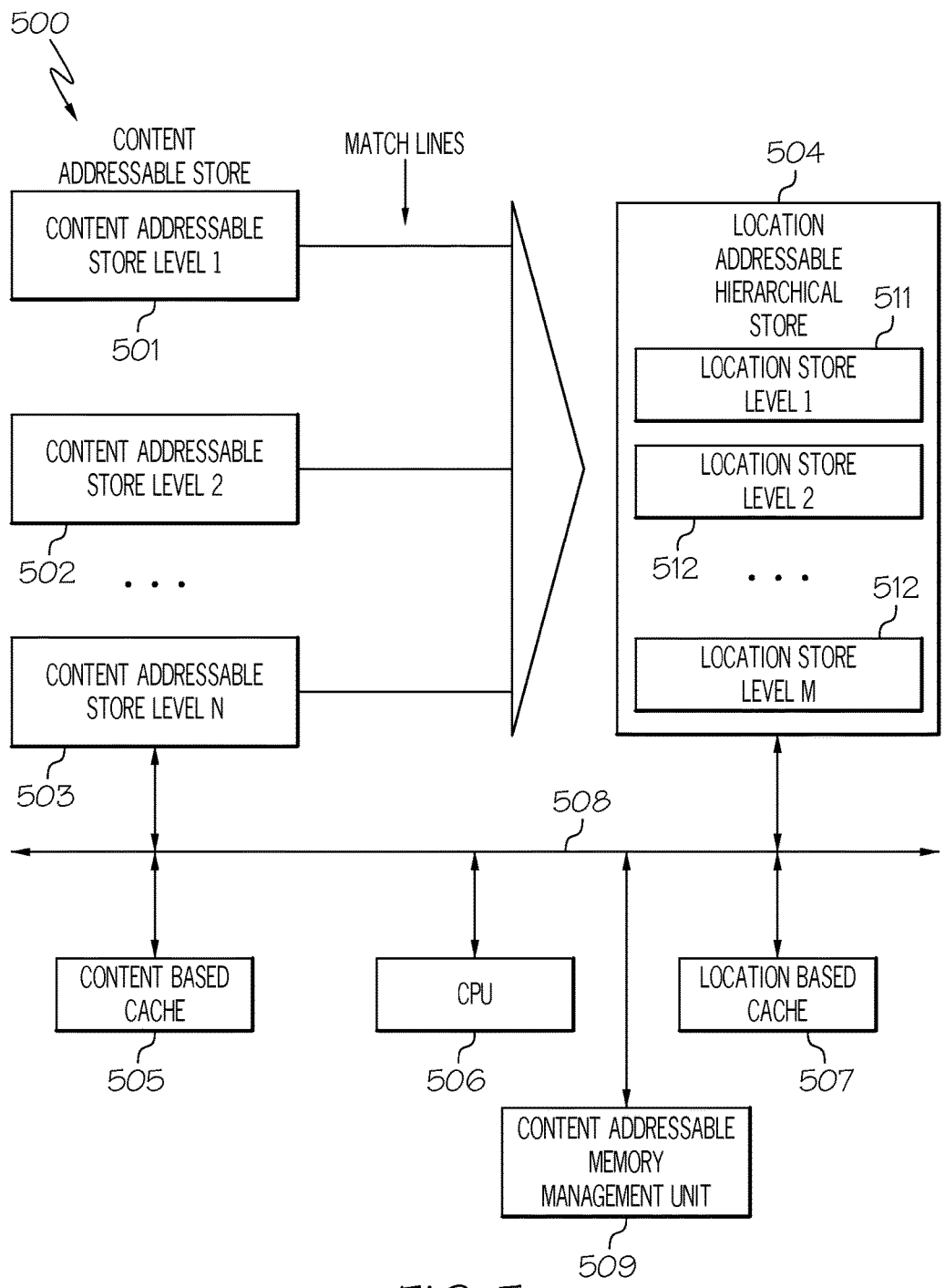
FIG. 5 is a block diagram of an example of a content memory system having a content addressable memory management (CAMMU) unit for managing content memory operations in the system, in accordance with aspects of the invention.

FIG. 5 depicts a block diagram of an example embodiment of a content addressable memory system of the invention that has a content addressable memory management (CAMMU) unit 509 for managing the operation of the memory system and providing virtual-physical address mapping in the system. Traditional notions of location based data paging and data blocks are replaced by content based paging and content blocks which operate on a content key space instead of a location space. Similar to FIG. 4, the content addressable memory system 500 of FIG. 5 has multiple levels of content addressable stores 501-503, location addressable store hierarchy 504 with location store levels 511-512, content based cache 505, and location based cache 507. These components communicate with CPU 506 through system bus 508. The depicted system further includes the content addressable memory management (CAMMU) unit 509 for managing content pages and memory addressing operations. The content stores (memories) 501-503 may be embodied using hardware, software or a combination thereof depending on the desired performance versus efficiency tradeoff criteria.

The content memory system with a memory management unit, as shown in FIG. 5, allows for locality oriented optimizations and provides for address mapping schemes that can preserve location based addressing where desired, for example, as a default compatibility mode or where it is more efficient. It retains the benefits of spatial locality and location based addressing where preferable, while enabling the full power of content addressability at a system level. This is a much more flexible and powerful model than existing content addressable memory systems which have mainly been limited to specialized systems such as network routers.

Since the mapping from content based address to physical location can be as fine grained as a single memory word, the invention enables an extremely high level of flexibility in data organization from a software perspective, by shifting the responsibility for optimization to lower levels of the system where new systems techniques and emerging technologies could be deployed. This also enables fine grained copy-on-write operations on in-memory data structures. Middleware and system software may use these benefits to reduce the incidence of software run-time bloat at a systemic level. The use of a content memory system for eliminating run-time bloat is more desirable than current alternatives which tend to require significant efforts in redesigning software applications, as well as customizing solutions for specific applications.

Computer with Content Addressable Memory Hierarchy

Figure 6:
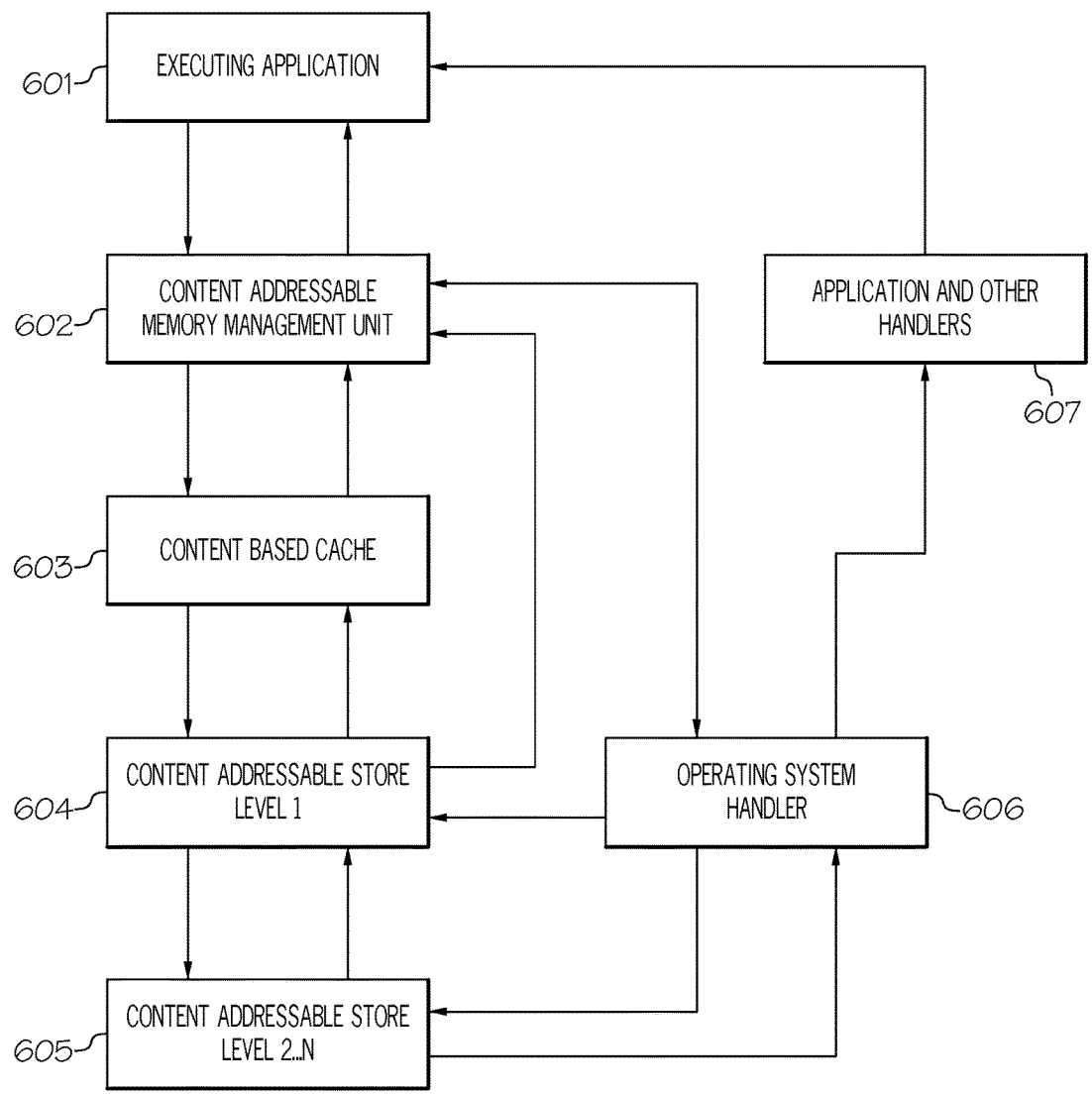
FIG. 6 is a flow chart of an example for searching and retrieving a desired content word from a content addressable memory system, in accordance with aspects of the invention.

FIG. 6 is a block diagram illustrating the interaction among various components in a computer having a content addressable memory hierarchy with a content addressable memory management unit (CAMMU) 602. An executing software application 601 accesses the content memory hierarchy by specifying <content word, relative offset> tuples to be read from or written to memory. The CAMMU unit 602 enables addressing operations, such as reading data from memory and writing data to the memory, to be serviced from the nearest level of the hierarchy where the desired data is present. The CAMMU unit 602 first checks the content based cache 603 and then level 1 content addressable store 604 for a match, and brings the data into the cache 603 if there is a match. If a matching content word is not found in the level 1 content addressable store 604, or the requested access is not allowed (e.g., a write attempt for read only data), then the CAMMU unit 602 generates a CAM miss exception or a CAM protection exception respectively. These exceptions are handled by operating system handler 606. Operating system handler 606 searches the content addressable store levels 2 to N (605) for a match and brings the corresponding content page into the level 1 store, and moves less used content pages to lower levels of the content memory hierarchy if necessary. The operating system handler 606 may also support copy-on-write operations in certain CAM protection exceptions. If no matching content word could be found even in content addressable levels 2 to N (605), then the operating system handler 606 returns an unhandled CAM exception notification. In this situation, the exception may be caught by other handlers or forwarded to an application handler 607 which is a special CAM exception handler pre-registered by the executing application. The application handler 607 may then handle this exception using application specific logic, e.g., it could create a new CAM entry for the desired CAM word, or it could simply return an error to the executing application 601 indicating that the operation failed.

Example Process for Searching Content Word

Figure 7:
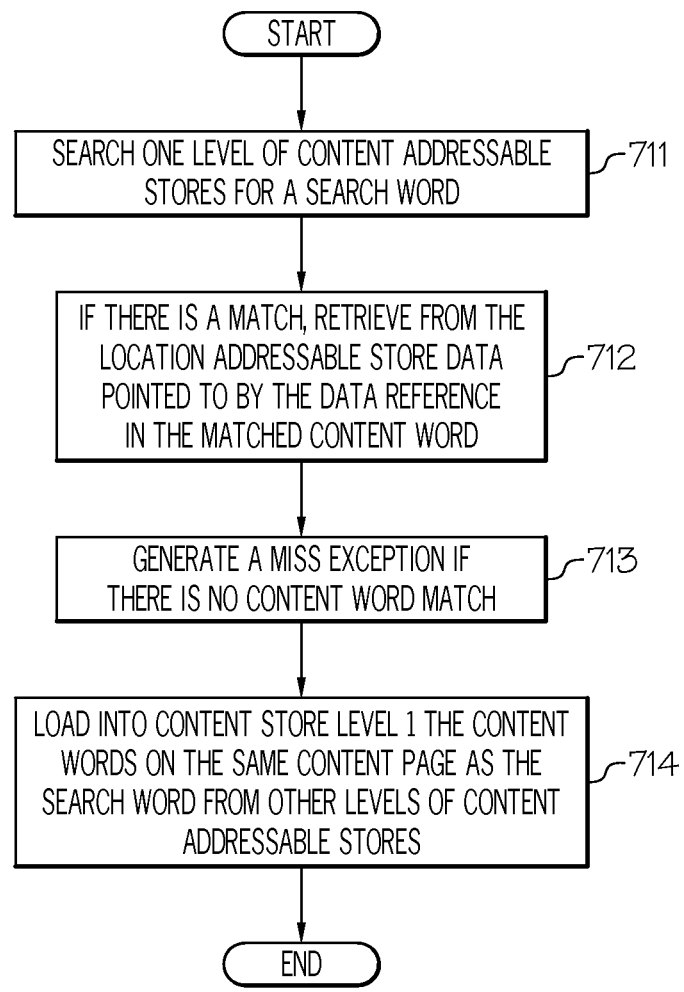
FIG. 7 is a flow chart of an example process for retrieving a desired content word from a content addressable memory system having a content based cache, in accordance with aspects of the invention.

Referring now to FIG. 7, there is depicted a flow chart of an example process for searching for a content word in a content addressable memory system, according to aspects of the invention. At block 711, the process searches for the desired content word in one of the levels of the content addressable stores of the content memory system, preferably in the highest level of the store hierarchy, i.e., the store level 1 which is closest to the processor. If there is a match between the searched content word and one of the content words in the store level 1, then the data item referenced by the matched content word in level 1 is retrieved from the location addressable store, per block 712. If there is no word match, then the content memory system generates a miss exception at block 713. In anticipating that the content words in the same content page as the searched word may likely be related to the searched word in terms of contents and thus also needed by the application, these content words are pre-loaded into level 1 of the content stores, at block 714.

Flow Chart For Retrieving A Content Word

Figure 8:
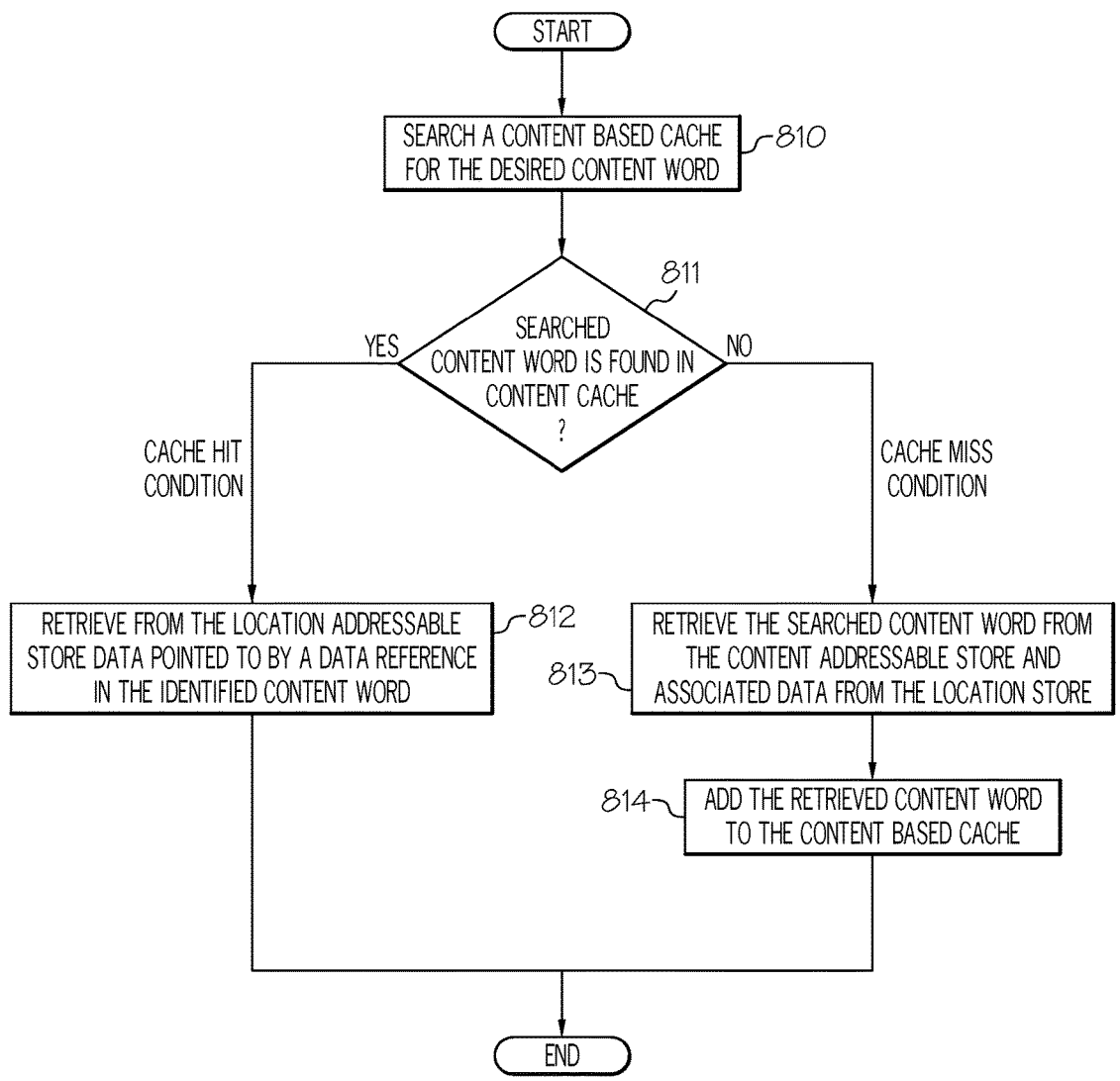
FIG. 8 is a block diagram illustrating the interactions among an application, an operating system, a hierarchical content addressable memory system, a CAMMU unit and a content cache, in an example of the invention.

FIG. 8 is a flow chart of an example embodiment of a process for retrieving a desired content word from a content addressable memory system that has a content based cache 405, in accordance with aspects of the invention. Memory accesses in a content addressable memory hierarchy may be specified, for example, using tuple <content word, relative offset>. The relative offset is an address offset to the address of the data in the location addressable memory, as referenced by the content word. The content memory system searches for the content word specified in the tuple by first searching the level 1 content addressable store for the content word to identify the data in the location store that is referenced by the content word. The content memory system then adds the relative offset to the location address of the referenced data to locate the desired data item. In a content addressable read operation, the memory system loads data from the resulting address in the location addressable store. In a content addressable write operation, the system stores data at the resulting address, if allowed by the protection status of the referencing entry in the content addressable store. If the search for a content word fails or a protection is violated, then the CAMMU unit may issue a CAM miss or CAM protection exception.

At block 810, the content memory system searches the content based cache to determine whether the content word being searched for may already be in the content cache 405. If the searched content word is present in the content cache 405, per block 811, then the data item in the location addressable store 404 that is referenced by the searched content word (currently in the content cache 405) is retrieved, at block 812. The condition of the searched content word being in the content cache 405 is referred to as a cache hit. On the other hand, if the searched content word is not in the content cache 405, then the system retrieves the searched content word from the content addressable store and data associated with the searched word from the location addressable store 404, per block 813. This data is referenced by a matching content word in the content addressable store 401-403. The system also adds the searched content word to the content cache 405 at block 814. The event of not finding a searched content word in the content based cache 405 is referred to as a cache miss.

Content Ordered Store Level 1

Figure 9:
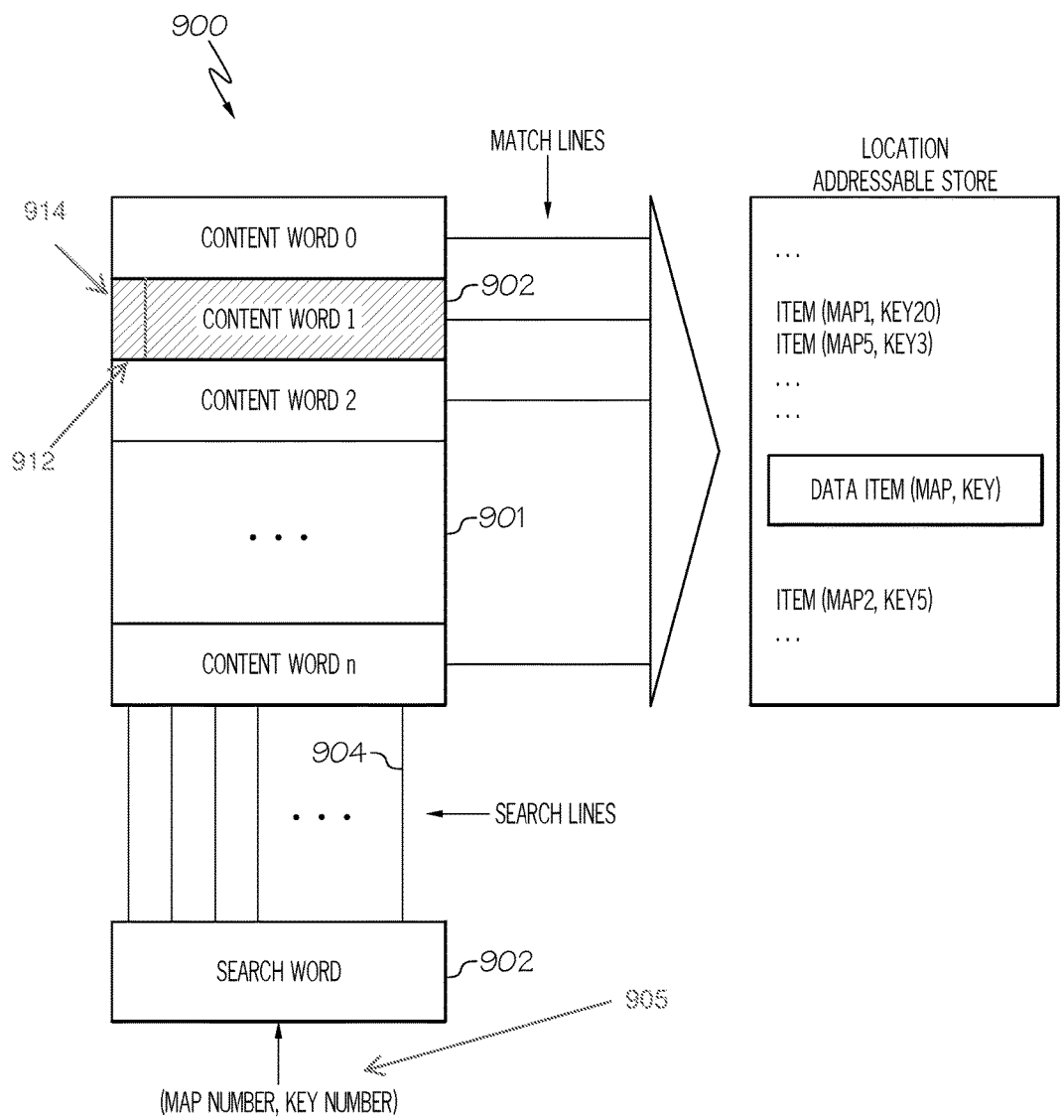
FIG. 9 is a block diagram showing an example of a search map for finding a desired content word in a content addressable memory system with multiple levels of stores with a next entry bit in the content word in a physical ordered sequence, in accordance with aspects of the invention.

FIG. 9 is a block diagram showing an example of a search map 901 for finding a desired content word in a content addressable memory system 900 with multiple levels of stores with a next entry bit 912 in the content word 914 in a physical ordered sequence, in accordance with aspects of the invention. As an example, the search map 901 is based on map-key relationships 902 provided in the content addressable memory stores for finding particular content words. Other search maps may use different relationships associated with the content words to search for the desired content words. Each map-key relationship 902 is associated with a content word 902 in the content addressable store 901. A map-key relationship 902 includes information on a search key, e.g., key 905, for identifying a respective content word 902 in the content addressable memory store 900. When a search word 905 needs to be looked up in the memory system 900, a map-key relationship for the search word 905, similar to the map-key relationships 902, is compared through match lines 904 to the map-key relationships 902 of the map-key table 901. If there is a match between the map-key relationship of the search word 905 and a map-key relationship 902 in the map-key table 910, then the content word 902 associated with the matching map-key relationship 902 is the search word 905 being searched for. Data item 907, which is in the location addressable store 906 and referenced by the matching content word 902, may then be identified through match lines 903 using the data reference of the matching content word.

Flow Chart For Retrieving A Content Word With Content Ordered Store

Figure 10:
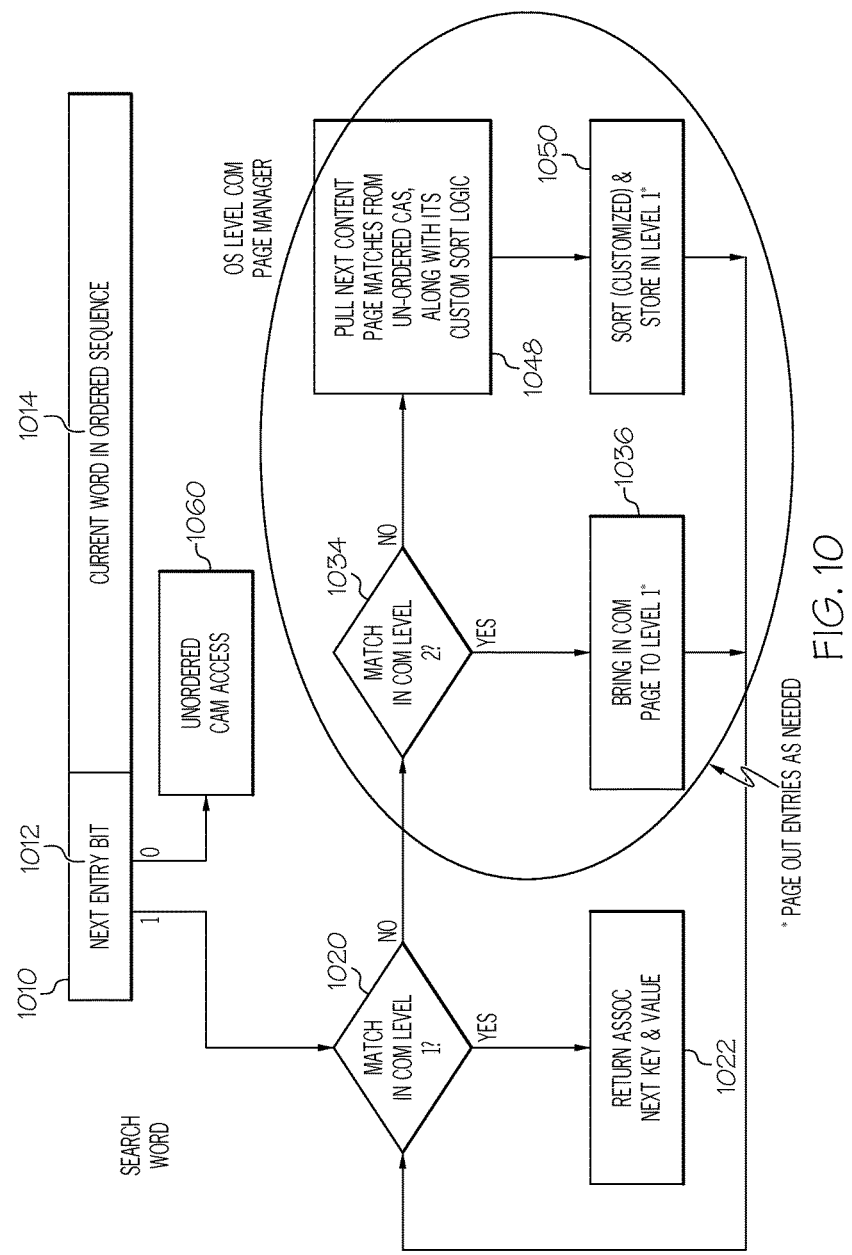
FIG. 10 is a flow chart of an example process for retrieving a desired content word from a content addressable memory system for retrieving content word in an ordered content store, in accordance with aspects of the invention.

FIG. 10 is a flow chart of an example process 1000 for retrieving a desired content word 1014 with a next entry bit 1010 from a content addressable memory system 900 for retrieving content word in an ordered content store, in accordance with aspects of the invention. The flow begins in this example with a test of the next entry bit 1010. In the event the next entry bit 1010 is "0" (zero) this is an unordered content access memory flow of FIG. 2-8 as described above. In the case that the next entry bit is "1" (one), the process flows to determine match in the content ordered memory at a current level (i.e. level 1) in step 1020. In the case of a match, the associated next key and value is returned in step 1022.

In the case there is not match in level the content ordered memory at a current level (i.e. level 1) in step 1020, the process continues to step 1034 to determine if there is a match in content ordered memory at a next level (i.e. level 2). In the case of a match, the content ordered memory page is brought into the level 1 of the content ordered memory in step 1036. The process returns to step 1020 as shown.

In the case that there is no is a match in content ordered memory at a next level (i.e. level 2) of step 1034, the process continues to step 1048 in which the next content pages matches are pulled from un-order content addressable storage along with its associate sorting logic in step 1048. The process continues to step 1050 to sort the store the contents in level 1 content order memory page. The process returns to step 1020 as shown.

In steps 1034, 1036, 1048, 1050, the entries are paged out as need. A hierarchical content addressable memory system may handle a cache miss by bringing a content page from the next lower level of the content addressable memory stores to the first level, by creating corresponding entries in the stores. If there is no matching content word entry in the content addressable hierarchy, then the application would get notified so that it can create a new mapping or otherwise handle the failure. The content memory system may handle a content write protection exception by making a copy of the referenced data and creating a writable entry that points to the copy.

The cost for additional flexibility in a content addressable memory hierarchy may be optimized in the context of corresponding use scenarios. Implementations may vary depend on the desired tradeoffs on performance, capacity, and cost. Also, the content words may be sorted in a physical ordered sequence is sorted using hardware acceleration, a general processor unit, ahybrid memory cube, or a combination thereof.

One of the benefits of a content based virtual memory model is that it provides applications with low level support for the content mapping of data structures. This can be quite useful for Java virtual machines, databases and other middleware systems, and also enables operating systems to efficiently use system memory.

There are different ways for managing content memory allocation and sharing the content addressable storage space across multiple processes running on a given system. In one example embodiment, the sharing a content addressable memory across application processes may be implemented as follows. Content words may include address group bits for a CAM name space to distinguish contents belonging to different processes. The embodiment may also provide some default local CAM entries per task that have location based addressing (typically, paged virtual memory) for applications that do not need the full capabilities of a CAM system. Possible variations include implementing a CAM based page mapping instead of traditional page or retaining a location based memory management unit so the local CAM entries map to a global virtual range.

Such a simple embodiment may be preferable to a more complex memory system when middleware software constitutes primary users of the CAM virtual memory, e.g., Java virtual machines and databases, rather than end applications. Most tasks that run directly on this platform may continue to use location based addressing compatibility, while middleware would setup CAM name spaces and use the full power of the CAM model. More involved setups may be needed when there is a large number of CAM name spaces to be supported, e.g., in multi-level memory mappings or additional state machine logic coupled with the CAM system.

Non-Limiting Examples

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The subject matter described above is provided by way of illustration only and should not be construed as limiting. Various modifications and substitutions of the described components and operations can be made by those skilled in the art without departing from the spirit and scope of the present invention defined in the following claims, the scope of which is to be accorded the broadest interpretation so as to encompass such modifications and equivalent structures. As will be appreciated by those skilled in the art, the systems, methods, and procedures described herein can be embodied in a programmable computer, computer executable software, or digital circuitry. The software can be stored on computer readable media. For example, computer readable media can include a floppy disk, RAM, ROM, hard disk, removable media, flash memory, a "memory stick", optical media, magneto-optical media, CD-ROM, etc.

What is claimed is:

1. A content addressable memory system, comprising:
    a location addressable store having data identified by location; and
    a plurality of content addressable stores each having content words with at least one next entry bit for sorting content words in a physical ordered sequence to create content ordered memory, each content word being associated with a reference to data in the location addressable store; wherein the content words corresponding to consecutive content values are consecutive in a content key space.

2. The memory system of claim 1, wherein the content words contain a range to map to a first entry of the content words stored in the physical ordered sequence.

3. The memory system of claim 1, wherein the sorting content words in a physical ordered sequence is sorted using at least one of hardware acceleration, general processor unit, and hybrid memory cube.

4. The memory system of claim 1, further comprising a content addressable memory management unit for mapping a virtual memory address in the content addressable memory system to a physical memory address in the content addressable memory system, wherein the content addressable memory management unit returns associated next key and value in response to a content word being found in a current level of the content addressable stores when searched.

5. The memory system of claim 1, further comprising a content addressable memory management unit for mapping a virtual memory address in the content addressable memory system to a physical memory address in the content addressable memory system, wherein the content addressable memory management unit raises a miss exception if a content word is not found in a current level of the content addressable stores when searched and searches a next level of content addressable stores for the content word.

6. The memory system of claim 5, wherein the content addressable memory management brings in the next level of content addressable stores into the content ordered memory in response to a search to the content word being found in a next level of the content addressable stores.

7. The memory system of claim 5, wherein the content addressable memory management brings in a next content page from unordered content addressable store along with its customer sort logic and sort and store content words in the next content page in the current level of content addressable stores.

8. The memory system of claim 1, wherein the content words are ternary content words.

9. The memory system of claim 1, wherein data reference for each content word points to inlined data in the content addressable stores.

10. The memory system of claim 1, wherein data reference for each content word points to another content word in the content addressable stores.

11. The memory system of claim 1, further comprising a content based cache for temporarily holding content words recently accessed.

12. The memory system of claim 11, wherein if a searched content word is not present in the content based cache, then the searched content word is brought into the content based cache from the content addressable stores.

13. The memory system of claim 11, further comprising a location based cache for temporarily holding data recently accessed.

14. The memory system of claim 1, further comprising a content addressable memory management unit for mapping a virtual memory address in the content addressable memory system to a physical memory address in the content addressable memory system.

15. The memory system of claim 14, wherein the content addressable memory management unit provides a protection mechanism for fine-grained entry-level copy-on-write accesses to the memory system.

16. The memory system of claim 14, wherein the content addressable memory management unit raises a miss exception if a content word is not found in a level of the content addressable stores when searched.

17. The memory system of claim 1, wherein the content key space comprises content pages each representing a collection of the content words having content key values within a page range of each other.

18. A method for retrieving data from a content addressable memory system having a location addressable store and a plurality of content addressable store levels each having content words with at least one next entry bit for sorting content words in a physical ordered sequence to create content ordered memory, wherein each content word is associated with a reference to data in the location addressable store and the content words corresponding to consecutive content values are consecutive in a content key space, the method comprising:
    searching a content addressable store level for a desired content word, wherein at least one content addressable store level contains content words in the physical ordered sequence; and
    retrieving data from the location addressable store using data reference associated with the desired content word if the desired word is found.

19. The method of claim 18, wherein the content words contain a range to map to a first entry of the content words stored in the physical ordered sequence.

20. A computer program product for retrieving data from a content addressable memory system having a location addressable store of data and a plurality of levels of content addressable stores each having content words with at least one next entry bit for sorting content words in a physical ordered sequence to create content ordered memory, wherein each content word is associated with a respective data reference in the location addressable store and the content words corresponding to consecutive content values are consecutive in a content key space, the product having a computer readable non-transitory storage medium comprising program code operable to:
    search a level of the content addressable stores for a desired content word, wherein at least one content addressable store level contains content words in the physical ordered sequence; and
    retrieve data from the location addressable store using data reference of associated with the desired word if the desired word is found.

* * * * *